(12) United States Patent
Sakamoto (10) Patent No.: US 8,928,208 B2
(45) Date of Patent: Jan. 6, 2015

(54) TUNING FORK-TYPE PIEZOELECTRIC RESONATOR PLATE AND TUNING FORK-TYPE PIEZOELECTRIC RESONATOR

(75) Inventor: Yoshinobu Sakamoto, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 297 days.

(21) Appl. No.: 13/639,149

(22) PCT Filed: Feb. 2, 2012

(86) PCT No.: PCT/JP2012/052425
§ 371 (c)(1),
(2), (4) Date: Oct. 3, 2012

(87) PCT Pub. No.: WO2012/108335
PCT Pub. Date: Aug. 16, 2012

(65) Prior Publication Data
US 2013/0020915 A1    Jan. 24, 2013

(30) Foreign Application Priority Data
Feb. 7, 2011 (JP) .................................. 2011-024231

(51) Int. Cl.
| H03H 9/21 | (2006.01) |
| H03H 3/02 | (2006.01) |
| H03H 9/02 | (2006.01) |
| H03H 9/05 | (2006.01) |
| H03H 9/10 | (2006.01) |

(52) U.S. Cl.
CPC ............ *H03H 3/02* (2013.01); *H03H 9/02133* (2013.01); *H03H 9/02149* (2013.01); *H03H 9/0519* (2013.01); *H03H 9/21* (2013.01); *H03H 9/1021* (2013.01); *H03H 2003/026* (2013.01)

USPC .......................... 310/370; 331/156; 333/200

(58) Field of Classification Search
CPC ... H03H 9/21; H03H 9/215; H03H 2003/026; G01C 19/56; B06B 1/0659
USPC .......................... 310/370; 333/200; 331/156
See application file for complete search history.

(56) References Cited

U.S. PATENT DOCUMENTS 8,400,048 B2 * 3/2013 Shirai et al. .................... 310/370
8,615,857 B2 * 12/2013 Numata ....................... 29/25.35
(Continued)

FOREIGN PATENT DOCUMENTS

| CN | 101878590 | 11/2010 |
| JP | 2004-200914 A | 7/2004 |
| JP | 2006-217603 A | 8/2006 |
| JP | 2008-079014 A | 4/2008 |

(Continued)

*Primary Examiner* — J. San Martin
(74) *Attorney, Agent, or Firm* — Marvin A. Motsenbocker; Mots Law, PLLC (57) ABSTRACT

A tuning fork-type piezoelectric resonator plate has a resonator blank comprising a pair of vibrating leg portions and a base portion from which the leg portions protrude. The pair of leg portions are arranged in parallel protrudingly from one end face of the base portion, and a pronged portion is formed between the pair of leg portions in an intermediate position in a width direction of the one end face of the base portion. The base portion has a pair of through holes along the one end face of the base portion, and on another end face side opposite to the one end face of the base portion, a joining region that joins to an external portion. The pair of through holes are specially positioned and have special wall surface configurations.

7 Claims, 5 Drawing Sheets

(56) References Cited

U.S. PATENT DOCUMENTS

2011/0043079 A1 2/2011 Shirai et al.
2012/0252319 A1* 10/2012 Fujihira ............................ 451/8
2013/0221808 A1* 8/2013 Morimoto et al. ............ 310/366

FOREIGN PATENT DOCUMENTS

| JP | 2010-178064 A | 8/2010 |
|---|---|---|
| WO | WO 2010/035714 A1 | 4/2010 |

\* cited by examiner

TUNING FORK-TYPE PIEZOELECTRIC RESONATOR PLATE AND TUNING FORK-TYPE PIEZOELECTRIC RESONATOR

TECHNICAL FIELD

The present invention relates to a tuning fork-type piezoelectric resonator plate used in an electronic device or the like, and a tuning fork-type crystal resonator using the same.

BACKGROUND ART

Piezoelectric resonator devices typified by piezoelectric resonators are widely used in mobile communication devices such as cellular phones and the like. A tuning fork-type piezoelectric resonator plate is one piezoelectric resonator plate used in piezoelectric resonators. A tuning fork-type piezoelectric resonator plate is a piezoelectric resonator plate shaped like a tuning fork that consists of a base portion and a pair of vibrating legs (hereinafter, referred to as leg portions) extending in one direction from the base portion, and tuning fork-type piezoelectric resonators that use tuning fork-type piezoelectric resonator plates are widely used as the clock source for clocks.

For example, with a tuning fork-type piezoelectric resonator plate described in the Patent Document 1, joining portions that join to an external portion are furthermore formed protrudingly from the other end face opposite to the end face of the base portion on which the two leg portions are formed. These joining portions that protrude from the other end face of the base portion are formed so as to branch in a T-shape along both side faces from the other end face of the base portion and extend such that respective tip portions thereof face in the same direction as the tips of the two leg portions.

With this tuning fork-type piezoelectric resonator, the main body casing is constituted by a base and a lid, and inside the main body casing the tip portions of the joining portions of the tuning fork-type piezoelectric resonator plate are electromechanically joined to the base using a conductive material, and the tuning fork-type piezoelectric resonator plate thus joined is hermetically sealed inside the main body casing. This tuning fork-type piezoelectric resonator enables vibration leakage (acoustic leaks) to be prevented.

PRIOR ART DOCUMENTS

Patent Documents

[Patent Document 1] JP 2004-357178A

SUMMARY OF INVENTION

Problems to be Solved by the Invention

Because the tip portions of the joining portions of the tuning fork-type crystal resonator plate are electromechanically joined to the base using a conductive material according to the tuning fork-type piezoelectric resonator described in the Patent Document 1, as described above, routing electrodes from the leg portions serving as vibrating portions to the joining positions to the base increase in length, making it difficult to convey the vibrations produced by the leg portions. However, because, on the other hand, the actual length via the base portion thereof increases given that the joining positions to the base are the tip portions of the joining portions and the vibrating portions are the leg portions, it becomes difficult to withstand vibration stress and the external force applied when the tuning fork-type piezoelectric resonator is impacted from the outside, resulting in the base portion and the joining portions being subjected to the stress or external force, and the piezoelectric resonator plate readily breaking. Also, because the total length of the joining portions in planar view increases, a mounting region for mounting the joining portions that are long in planar view needs to be secured on the base, hindering miniaturization of the main body casing of the piezoelectric resonator as a result.

The present invention is made in view of the above points, and has as its object to provide a tuning fork-type piezoelectric resonator plate that prevents acoustic leaks as well as being resistant to stress and external force and suitable for miniaturization, and a tuning fork-type piezoelectric resonator.

Means for Solving the Problems

In order to attain the above object, a tuning fork-type piezoelectric resonator plate according to the present invention has a piezoelectric resonator blank that is constituted by a pair of leg portions serving as vibrating portions and a base portion from which the leg portions protrude, the pair of leg portions being arranged in parallel protrudingly from one end face of the base portion, with a pronged portion being formed between the pair of leg portions in an intermediate position in a width direction of the one end face of the base portion, the base portion having formed therein a pair of through holes along the one end face of the base portion, and having, on another end face side opposite to the one end face of the base portion, a joining region that joins to an external portion, the pair of through holes being formed in positions closer to a center line in the width direction of the base than to base end portions of the pair of leg portions, in a state where both of the through holes are not in contact with each other, and with the through holes, a plane area of the through holes progressively decreasing in size toward an inner portion of the piezoelectric resonator blank from both end portions of the through holes in both back and front main surfaces of the piezoelectric resonator blank, and a wall surface of the through holes being formed in a spiral shape.

According to the present invention, acoustic leaks can be prevented more efficiently without hindering miniaturization of the tuning fork-type piezoelectric resonator plate, and problems such as breakage of the tuning fork-type piezoelectric resonator plate can be prevented due to its resistance to stress and external force.

In other words, vibration leakage (acoustic leaks) caused by the vibrations generated when driving the tuning fork-type piezoelectric resonator plate being out of sync can be suppressed, because the pronged portion is formed in an intermediate position in the width direction of one end face of the base portion, the base portion has the pair of through holes formed therein along the one end face of the base portion and has the joining region on the other end face side opposite to the one end face of the base portion, and the pair of through holes are formed at positions closer to the center line of the base portion than to base end portions of the pair of leg portions in a state where both of the through holes are not in contact with each other. Propagation of part of the vibrational energy produced in the pair of leg portions to the joining region can also be stopped by the through holes formed in the base portion.

In particular, because the through holes are formed so that the plane area of the through holes progressively decreases in size, like an hourglass, toward the inner portion of the piezoelectric resonator blank from both end portions of the through holes in both front and back main surfaces of the piezoelectric resonator blank, and, moreover, the wall surfaces of the through holes are also formed in a spiral shape, stress from the outside can also be distributed over the spiral wall surfaces of the through holes while gradually weakening, and propagation of part of the vibrational energy produced by the pair of leg portions can also be released over the spiral wall surfaces of the through holes while gradually weakening. As a result, vibration leakage (acoustic leaks) can be suppressed more efficiently, and a configuration that is resistant to stress and external force can be realized as the joining region with an external portion. Although oscillation frequency shift or the like may occur, for example, as a result of joining the tuning fork-type piezoelectric resonator plate to another member such as mounting the tuning fork-type piezoelectric resonator plate to an external portion, or as a result of an external force being exerted on the tuning fork-type piezoelectric resonator plate, the present invention enables such problems to be greatly reduced. Also, because the occurrence of physical and electrical breaks in the joining region can be suppressed, durability such as shock resistance is improved.

Also, in the above configuration, a pair of driving electrodes, and extraction electrodes respectively extracted from the pair of driving electrodes, may be formed on the back and front main surfaces of the piezoelectric resonator blank, the pair of through holes may be formed in formation regions of the extraction electrodes, conducting electrodes may be formed in the pair of through holes, and the extraction electrodes formed on the back and front main surfaces may be electrically connected using the conducting electrodes, and part of the extraction electrodes may be in contact with the pronged portion without being extracted between the base end portions of the pair of leg portions.

In this case, since a wiring structure that extends the extraction electrodes between the back and front main surfaces via an edge portion or side end face around the pronged portion or another edge portion and side end face of the base portion close to the pronged portion is not needed, a configuration with stable electrical connectivity in which the likelihood of disconnection or the like is reduced can be realized, in addition to the operative effects. Also, since a simpler wiring pattern design in which the likelihood of disconnection or the like is reduced is also facilitated with regard to the extraction electrodes formed on the main surfaces of the base portion, since part of the extraction electrodes are in contact with the pronged portion without being extracted between the base end portions of the pair of legs, miniaturization of the base portion of the tuning fork-type piezoelectric resonator plate can also be realized at the same time.

In particular, because the through holes are formed so that the plane area of the through holes progressively decreases in size, like an hourglass, toward the inner portion of the piezoelectric resonator blank from both end portions of the through holes in both front and back main surfaces of the piezoelectric resonator blank, and, moreover, the wall surfaces of the through holes are also formed in a spiral shape, the surface area of the through holes can be increased, and even if the conducting electrodes are formed on only the wall surfaces of the through holes thus formed, the electrodes can be formed on the wall surfaces of the through holes in a more stable state, reducing the likelihood of disconnection and stabilizing the conduction state. Also, because the through holes are formed so that the plane area of the through holes progressively decreases in size, like an hourglass, toward the inner portion of the piezoelectric resonator blank from both end portions of the through holes in both front and back main surfaces of the piezoelectric resonator blank, and, moreover, the wall surfaces of the through holes are also formed in a spiral shape, the occurrence of voids in the through holes can be suppressed even if the conducting electrodes are formed by filling the through holes thus formed with the conducting electrodes, and separation of the conducting electrodes from inside the through holes can be prevented due to an anchor effect that occurs where the conducting electrodes are joined inside the through holes, reducing the likelihood of disconnection and stabilizing the conduction state.

Also, in the above configuration, a piezoelectric resonator blank may be constituted by a pair of leg portions serving as vibrating portions, a joining portion that joins to an external portion, and a base portion from which the leg portions and the joining portion protrude, the pair of leg portions may be arranged in parallel protrudingly from one end face of the base portion, and a pronged portion may be formed between the pair of leg portions in an intermediate position in a width direction of the one end face of the base portion, the base portion may have formed therein a pair of through holes along the one end face of the base portion, the joining portion may protrude, on another end face opposite to the one end face of the base portion, from a position opposite to the pronged portion, and may have a first joining region that joins to an external portion, and the first joining region may have a first joining region that joins to an external portion, in a region that is in an intermediate position in the width direction of the joining portion.

In this case, in addition to the abovementioned operative effects, vibration leakage (acoustic leaks) caused by the vibrations generated when driving the tuning fork-type piezoelectric resonator plate being out of sync can be more effectively suppressed without expanding the length or area of the joining portion, because the pronged portion is formed in an intermediate position in the width direction of one end face of the base portion, the base portion has the pair of through holes formed therein along the one end face of the base portion, and the joining portion protrudes, on the other end face opposite to the one end face of the base portion, from a position opposite to the pronged portion and has at least a first joining region that joins to an external portion in a region in an intermediate position in the width direction of the joining portion. In particular, since propagation of part of the vibrational energy produced in the pair of leg portions to the first joining region of the joining portion can also be more efficiently stopped as a result of the through holes formed like an hourglass and whose wall surfaces are also formed in a spiral shape being added, vibration leakage (acoustic leaks) can be suppressed more efficiently, and a configuration that is resistant to stress and external force can be realized as the joining region with an external portion. Also, since the occurrence of physical and electrical breaks in the joining portion can be suppressed, durability such as shock resistance is improved.

Also, in the above configuration, the through holes may be formed in positions on line segments connecting the first joining region and the base end portions of the leg portions.

In this case, in addition to the abovementioned operative effects, propagation of the vibrational energy can also be more efficiently stopped, using the through holes formed in positions on line segments connecting the first joining region to the base end portions of the pair of leg portions, enabling vibration leakage (acoustic leaks) to be suppressed even more efficiently.

Also, in the above configuration, the joining portion may be formed in an L-shape in planar view, and the first joining region may be formed in a bend portion which is a location of a bend formed in the L-shape in planar view, and a second joining region that joins to an external portion may be formed in a tip portion of the joining portion.

In this case, vibration leakage (acoustic leaks) can be suppressed without expanding the length of the joining portion, in addition to the abovementioned operative effects. In particular, the first joining region of the joining portion that joins to an external portion can be electromechanically joined as one pole at the bend portion where acoustic leaks are more efficiently suppressed, the second joining region of the joining portion that joins to an external portion can be joined electromechanically as an opposite to pole at the tip portion that is not affected by acoustic leaks or by stress or external force.

Also, in the above configuration, a relationship of a shortest distance D1 being greater than a combined shortest distance D4 may be satisfied, where a boundary point P1 is a boundary point between the pronged portion and the vibrating portions, a shortest point P2 is a point on a side face of the base portion at which a distance from the boundary point P1 on the base portion to the side face is shortest, the shortest distance D1 is a distance from the boundary point P1 to the shortest point P2, a distance D2 is a shortest distance connecting the boundary point P1 and the through holes, a shortest point P3 is a point on the side face of the base portion at which a distance from the through holes in the base portion to the side face is shortest, a distance D3 is a distance connecting the through holes and the shortest point P3, and the combined shortest distance D4 is a combined shortest distance obtained by combining the distance D2 and the distance D3.

In this case, because the relationship of the shortest distance D1 being greater than the combined shortest distance D4 is satisfied, stress that propagate to the joining portion can be suppressed.

Also, in order to attain the above object, a tuning fork-type piezoelectric resonator has a tuning fork-type piezoelectric resonator plate according to the present invention provided inside a casing of the tuning fork-type piezoelectric resonator. The present invention can also be applied to a tuning fork-type piezoelectric resonator, constituted as mentioned above, in which a first joining region of a tuning fork-type piezoelectric resonator plate is joined to a holding unit inside the casing, and has similar operative effects as a tuning fork-type piezoelectric resonator in which the abovementioned tuning fork-type piezoelectric resonator plate is joined to a holding unit inside the casing.

Effects of the Invention

As mentioned above, the present invention enables a tuning fork-type piezoelectric resonator plate that prevents acoustic leaks as well as being resistant to stress and external force and suitable for miniaturization and a tuning fork-type piezoelectric resonator to be provided.

MODES FOR CARRYING OUT THE INVENTION

Hereinafter, description will be given together with the drawings, taking a tuning fork-type crystal resonator as an example. A tuning fork-type crystal resonator 1 used in the present embodiment has a casing that is constituted by a base 3 and a lid which is not illustrated being joined via a sealing member H. Specifically, a configuration is adopted in which a tuning fork-type crystal resonator plate 2 is joined onto electrode pads 32 of the base 3, which is upwardly open, via metal films M1 such as plated bumps, and the lid is joined to the base 3 via the sealing member H, hermetically sealing a housing portion (see below). Here, with the present embodiment, the nominal frequency of the tuning fork-type crystal resonator 1 is 32.768 kHz. Note that this nominal frequency is exemplary, and the present invention is also applicable to other frequencies.

Figure 1:
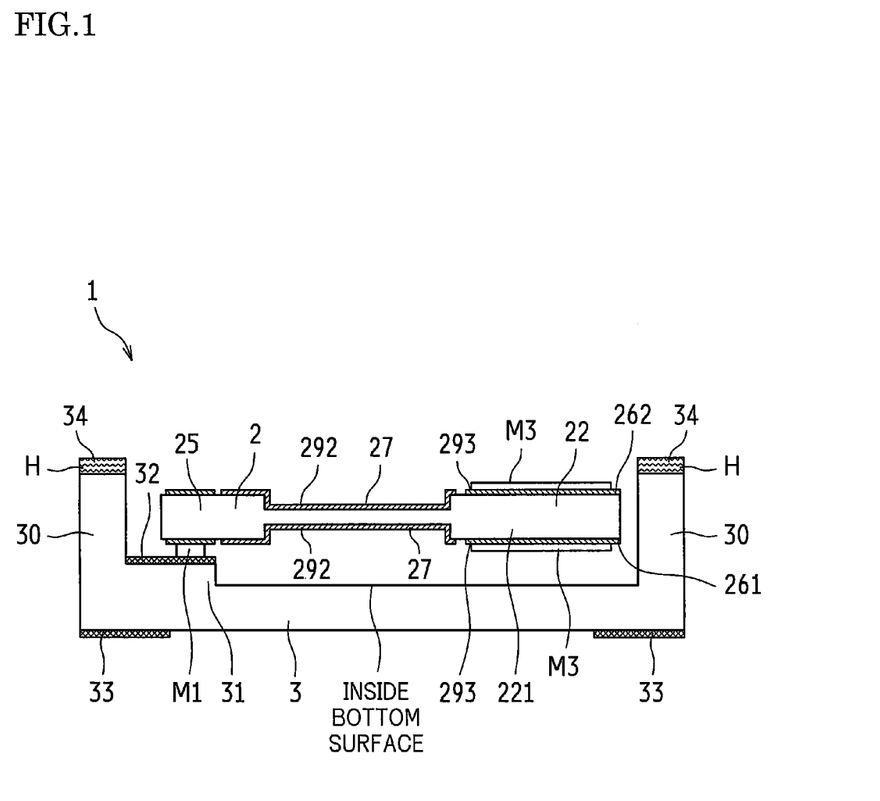
FIG. 1 is a diagram illustrating a configuration of a tuning fork-type crystal resonator illustrating an embodiment of the present invention, and is a typical cross-sectional view of the tuning fork-type crystal resonator when a tuning fork-type crystal resonator plate arranged in the tuning fork-type crystal resonator is cut at an A-A line illustrated in FIG. 2.

The base 3 is constituted by an insulated container body consisting of a ceramic material, a glass material, a resin material or the like, for example. The base 3 has a bank portion 30 therearound and, moreover, is formed into a recessed shape in cross-sectional view that is upwardly open, and a stepped portion 31 for mounting the tuning fork-type crystal resonator plate 2 is formed on the inner portion of the base 3 (housing portion). A pair of electrode pads 32 (only one illustrated in FIG. 1) for mounting the tuning fork-type crystal resonator plate 2 are formed on the upper surface of the stepped portion 31. The pair of electrode pads 32 are electrically connected to two or more terminal electrodes 33 formed on the bottom surface (underside) of the base 3 via a wiring pattern (not illustrated) formed on the inner portion of the base 3. A metal film layer 34 (constituting part of the sealing member H) is formed on the upper surface (periphery) of the bank portion 30 of the base 3 circumferentially along the upper surface. For example, in the case where a ceramic material is used for the base 3, the electrode pads 32, the terminal electrodes 33 and the metal film layer 34 are constituted by a three-layer laminate, for example, and are laminated in order of tungsten, nickel and gold from the bottom up. Tungsten is integrally formed using metallization technology at the time of ceramic firing, and the nickel and gold layers are each formed using plating technology. Note that molybdenum may be used in the tungsten layer.

The lid which is not illustrated consists of a metal material, a ceramic material, a glass material or the like, for example, and is formed as a single plate that is rectangular in planar view. A sealing agent (constitutes part of the sealing member H) is formed on the undersurface of this lid. This lid is joined to the base 3 via the sealing member H using a technique such as seam welding, beam welding or heat fusion joining to constitute the casing of the tuning fork-type crystal resonator 1 consisting of the lid and the base 3.

The tuning fork-type crystal resonator plate 2 is a piezoelectric resonator blank, and a large number of tuning fork-type crystal resonator plates 2 are batch formed from a single crystal wafer (illustration omitted) consisting of a crystal Z plate of an anisotropic material. With regard to shaping these tuning fork-type crystal resonator plates 2, a resist or a metal film is formed on the crystal wafer using photolithography, and the tuning fork-type crystal resonator plates 2 are shaped by wet etching, for example, using the resist or metal film formed on the crystal wafer as a mask.

Figure 2:
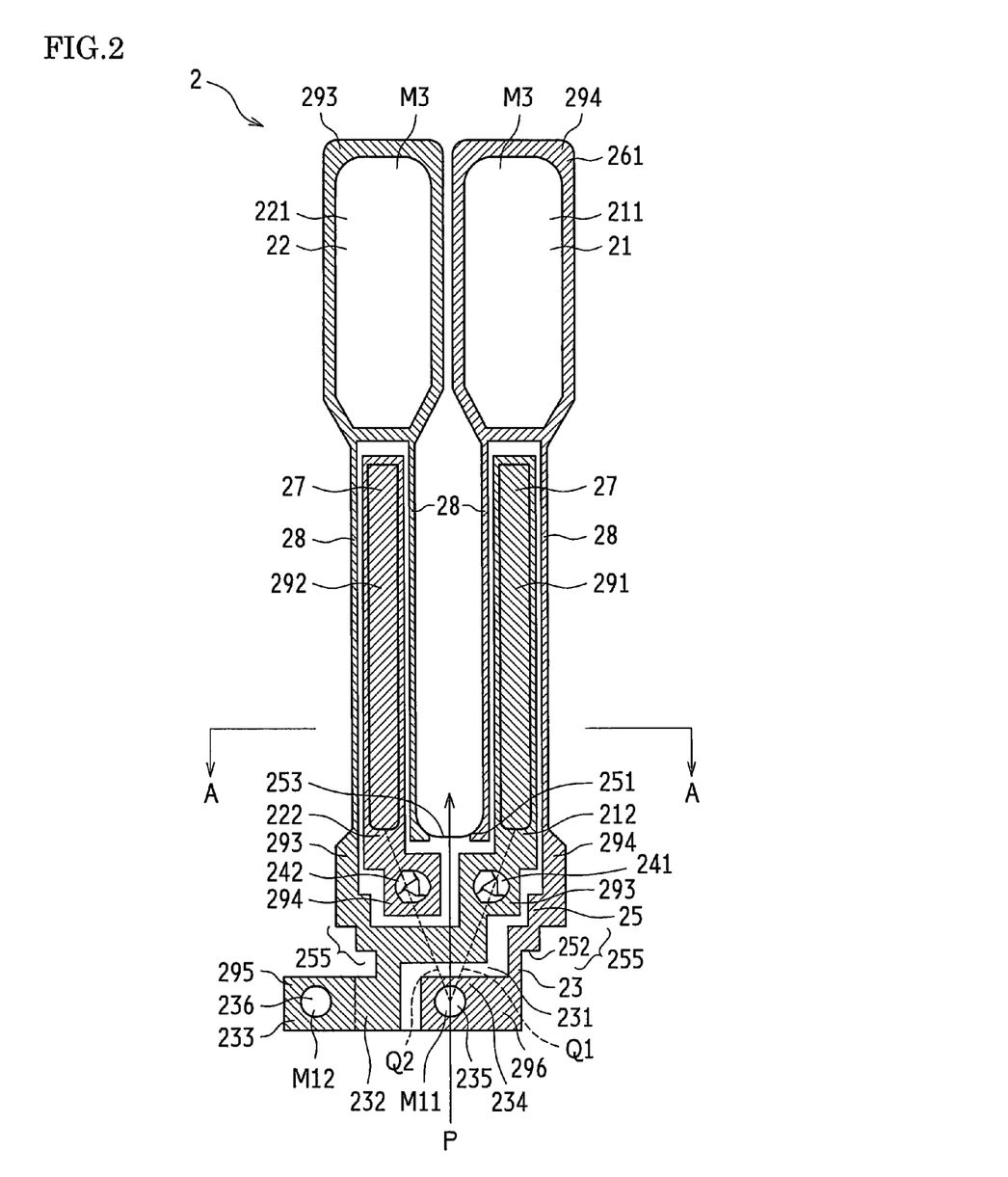
FIG. 2 is a planar view of one main surface of the tuning fork-type crystal resonator plate illustrating an embodiment of the present invention.
Figure 3:
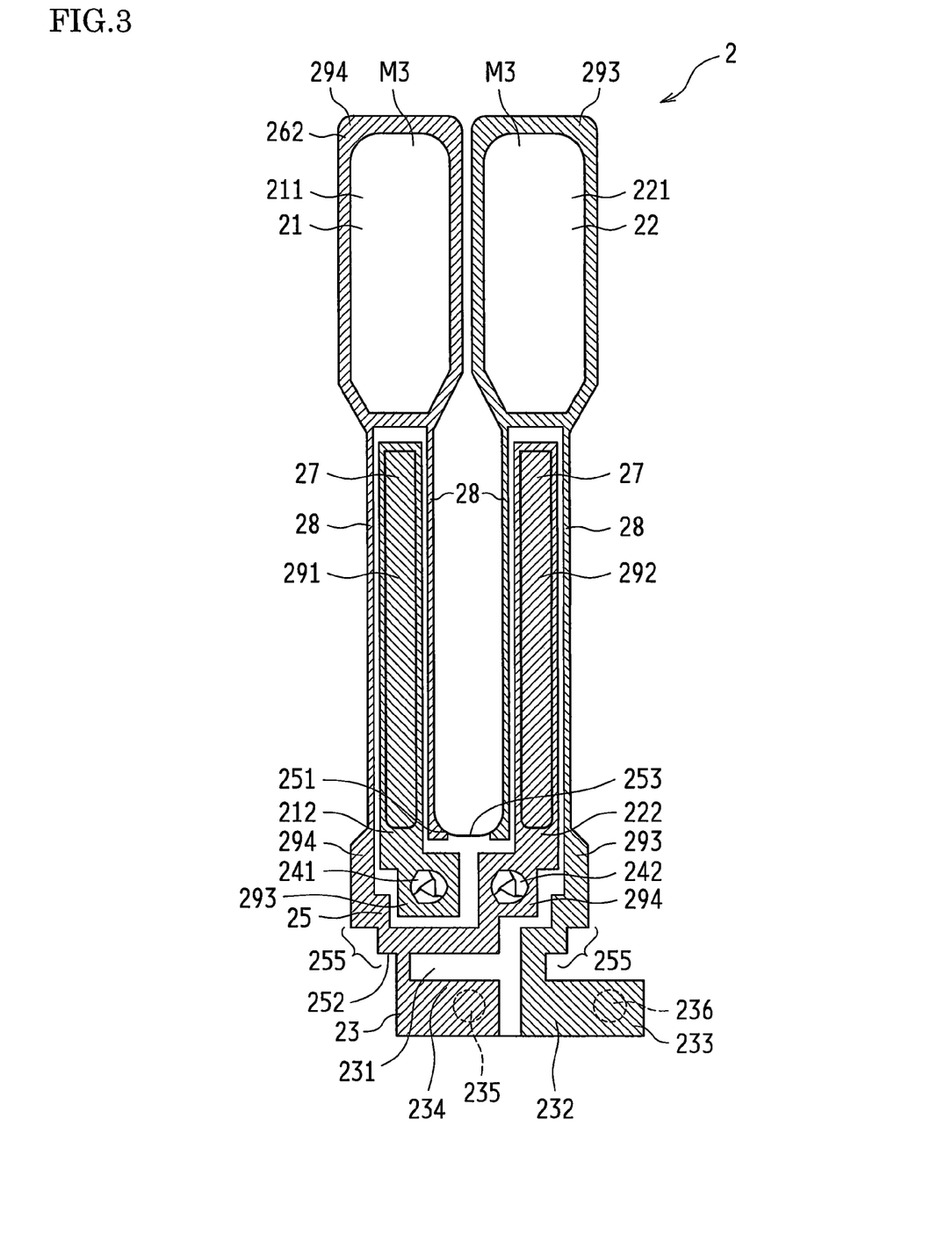
FIG. 3 is a planar view of the other main surface of the tuning fork-type crystal resonator plate illustrating an embodiment of the present invention.

The tuning fork-type crystal resonator plate 2, as is illustrated in FIGS. 2 and 3, is constituted by a pair of a first leg portion 21 and a second leg portion 22 serving as vibrating portions, a joining portion 23 that joins to an external portion (the electrode pads 32 of the base 3 in the present embodiment), and a base portion 25 from which the first leg portion 21, the second leg portion 22, and the joining portion 23 protrude. Also, a pronged portion 253 is formed between the pair of the first leg portion 21 and the second leg portion 22 in an intermediate position in the width direction of one end face 251 of the base portion 25. At least a pair of driving electrodes 291 and 292 and extraction electrodes 293 and 294 respectively extracted from the pair of driving electrodes 291 and 292 are formed on both back and front main surfaces (one main surface 261 and the other main surface 262) of the tuning fork-type crystal resonator plate 2. Also, connection electrodes 295 and 296 serving as lead-out end portions of the extraction electrodes 293 and 294 and formed in the joining portion 23 that is joined to an external portion are formed on the one main surface 261 of the tuning fork-type crystal resonator plate 2. Also, part of the extraction electrodes 293 and 294 (other end portions 297 and 298) are extracted to the pronged portion 253 (includes the vicinity of the pronged portion 253). In particular, in the present embodiment, through holes 241 and 242 are formed and the extraction electrodes 293 and 294 are routed using the through holes 241 and 242. Thus, the extraction electrodes 293 and 294 need not be routed in the pronged portion 253, enabling the other end portions 297 and 298 of the extraction electrodes 293 and 294 to be positioned in the pronged portion 253 (includes the vicinity of the pronged portion 253). Thus, in the present embodiment, a routing pattern of the extraction electrodes 293 and 294 does not need to be designed between the pronged portion 253 and the through holes 241 and 242, and the other end portions 297 and 298 of the extraction electrodes 293 and 294 contact the pronged portion 253 (includes the vicinity of the pronged portion 253) without being extracted between the base end portion 212 of the first leg portion 21 and the base end portion 222 of the second leg portion 22. Thus, the other end portions 297 and 298 of the extraction electrodes 293 and 294 contact the pronged portion 253 (includes the vicinity of the pronged portion 253), and disconnection does not occur even if a formation shift of the extraction electrodes 293 and 294 occurs. Also, given that a routing pattern of the extraction electrodes 293 and 294 is not designed in the pronged portion 253 (includes the vicinity of the pronged portion 253), the driving electrodes 291 and 292 can be widened and increased in size. As a result, series resonance resistance (crystal impedance (CI) value) can be reduced. Also, given that a design region for a routing pattern of the extraction electrodes 293 and 294 does not need to be secured near the pronged portion 253 (includes the vicinity of the pronged portion 253) of the tuning fork-type crystal resonator plate 2, the plate of the pronged portion 253, the base end portion 212 of the first leg portion 21 and the base end portion 222 of the second leg portion 22 does not need to be formed into a tapered shape or a circular shape having a large radius with the aim of conducting electricity to the extraction electrodes 293 and 294, and miniaturization of the tuning fork-type crystal resonator plate 2 can be readily addressed. A simpler wiring pattern design with a reduced likelihood of disconnection and the like is thus facilitated with regard to the extraction electrodes 293 and 294 formed on both back and front main surfaces (the one main surface 261 and the other main surface 262) of the base portion 25 of the tuning fork-type piezoelectric resonator plate 2, and miniaturization of the base portion 25 of the tuning fork-type piezoelectric resonator plate 2 can be realized at the same time.

The base portion 25 has a mirror symmetrical shape in planar view, and, as illustrated in FIGS. 2 and 3, is formed wider than the vibrating portions (see the first leg portion 21 (particularly the base end portion 212) and the second leg portion 22 (particularly the base end portion 222)). Also, steps are incrementally formed near the other end face 252 of the base portion 25 so as to narrow from the one end face 251 to the other end face 252. Leakage vibration generated by the vibrations of the first leg portion 21 and the second leg portion 22 serving as the vibrating portions can thus be attenuated using the other end face 252, and conveyance of leakage vibration to the joining portion 23 can be suppressed, with such a configuration being favorable for further reducing acoustic leaks (vibration leakage) as a result. Note that as for the configuration referred to here that becomes incrementally narrower, the portion denoted is where the width of the base portion 25 is narrow and becomes narrower relative to near the one end face 251 where the width dimension of the base portion 25 is large, with reference to the overall shape of the base portion 25 in planar view (hereinafter, this portion is referred to as constricted portion 255), and that the portion of this constricted portion 255 where the width of the base portion 25 is narrowest is one end, and this one end of the constricted portion 255 is the boundary (boundary point) between the other end face 252 of the base portion 25 and the joining portion 23 and is P3 illustrated in FIG. 5. Also, the constricted portion 255 is not limited to the stepped shape shown in FIGS. 2 and 3, and may have a tapered shape, a curved shape, or be a combination of these shapes.

Also, the pair of through holes 241 and 242 are formed in the one end face 251 of the base portion 25 so as to be arranged along (in parallel to) the one end face 251. The pair of through holes 241 and 242 are formed at positions closer to a center line P in the width direction of the base portion 25 (see FIGS. 2 and 3) than to the base end portions 212 and 222 of the pair of leg portions 21 and 22 which will be discussed later, and line symmetrically to the center line P in the width direction of the base portion 25 in a state where both of the through holes 241 and 242 are not in contact with each other.

Also, the pair of through holes 241 and 242 are formed in positions on line segments Q1 and Q2, where Q1 is a line segment connecting a first joining region 235 which will be discussed later and the center of the base end portion 212 of the leg portion 21, and Q2 is a line segment connecting the first joining region 235 and the center of the base end portion 222 of the leg portion 22, in relation to the pair of through holes 241 and 242. Propagation of vibrational energy can also thus be stopped more efficiently, enabling vibration leakage (acoustic leaks) to be suppressed even more efficiently.

Also, the through holes 241 and 242 are formed in formation regions of the extraction electrodes 293 and 294, and conducting electrodes which are not illustrated are formed inside the through holes 241 and 242. The conducting electrodes formed inside the through holes 241 and 242 may be formed only on a wall surface S1 of the through holes 241 and 242, or may be formed in a state where the through holes 241 and 242 are filled with the conducting electrodes. As a result of such a configuration of the through holes 241 and 242, routing is respectively carried out from the extraction electrodes 293 and 294 formed on the one main surface 261 to the extraction electrodes 293 and 294 of the same pole on the other main surface 262.

Also, the wall surface inside the through holes 241 and 242, as shown in the planar view of FIG. 4(a), consists of a plurality of wall surfaces S1, and the wall surface inside the through holes 241 and 242 is formed in a spiral shape using these plurality of wall surfaces S1. Also, with the through holes 241 and 242, as shown in the cross-sectional view of FIG. 4(b), the plane area of the through holes 241 and 242 (the area of the openings of the through holes 241 and 242 related to the diameter and width of the openings) becomes progressively (incrementally) smaller in size, like an hourglass, toward an inner portion T3 of the tuning fork-type crystal resonator plate 2 from both of the end portions T1 and T2 of the through holes 241 and 242 in both back and front main surfaces (the one main surface 261 and the other main surface 262) of the tuning fork-type crystal resonator plate 2. Such a configuration of the through holes 241 and 242 can be realized by optimally managing the etching time as well as optimally setting the temperature, concentration and the like of an etching solution so as to avoid over-etching, when forming the through holes 241 and 242 by wet etching on an anisotropic crystal material such as quartz crystal.

Figure 4:
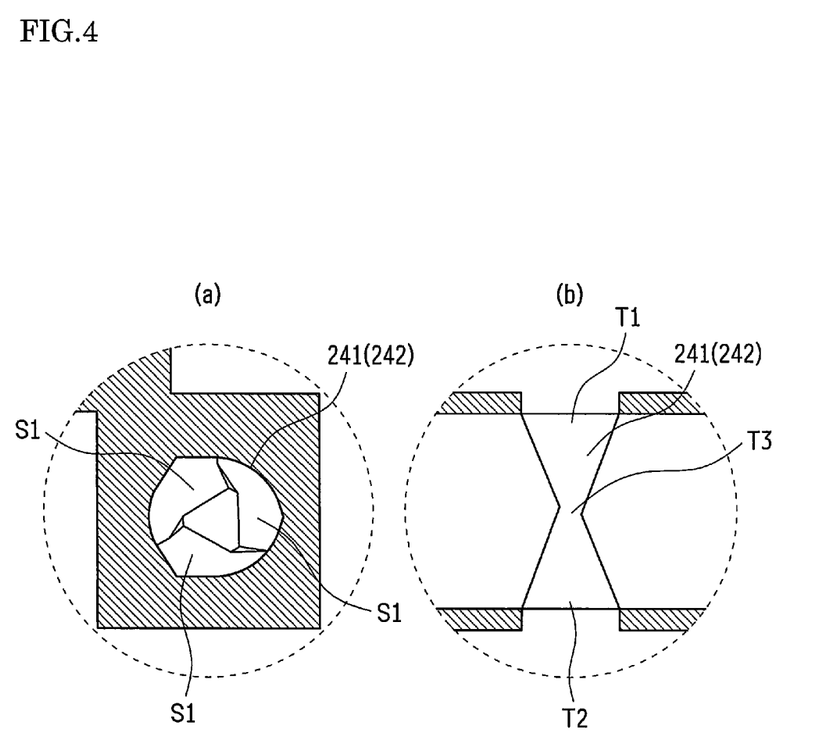
FIG. 4 consists of FIG. 4(a) and FIG. 4(b), with FIG. 4(a) being a typical planar view of a through hole formed in the tuning fork-type crystal resonator plate illustrating an embodiment of the present invention, and FIG. 4(b) being a typical cross-sectional view thereof.

Also, by adopting a shape of the through holes 241 and 242 such as illustrated in FIG. 4, stress from the outside can also be distributed over the plurality of spirally arranged (formed) wall surfaces S1 while gradually weakening, and propagation of part of the vibrational energy produced by vibration of the first leg portion 21 and the second leg portion 22 serving as vibrating portions can also be released over the spiral wall surfaces S1 of the through holes 241 and 242 while gradually weakening.

Also, because the plane area of the through holes 241 and 242 can be incrementally decreased in size toward the inner portion T3 of the through holes 241 and 242 from both of the end portions T1 and T2 of the through holes 241 and 242, the surface area of the through holes 241 and 242 can be increased and the conduction state of the conducting electrodes can be stabilized.

Figure 5:
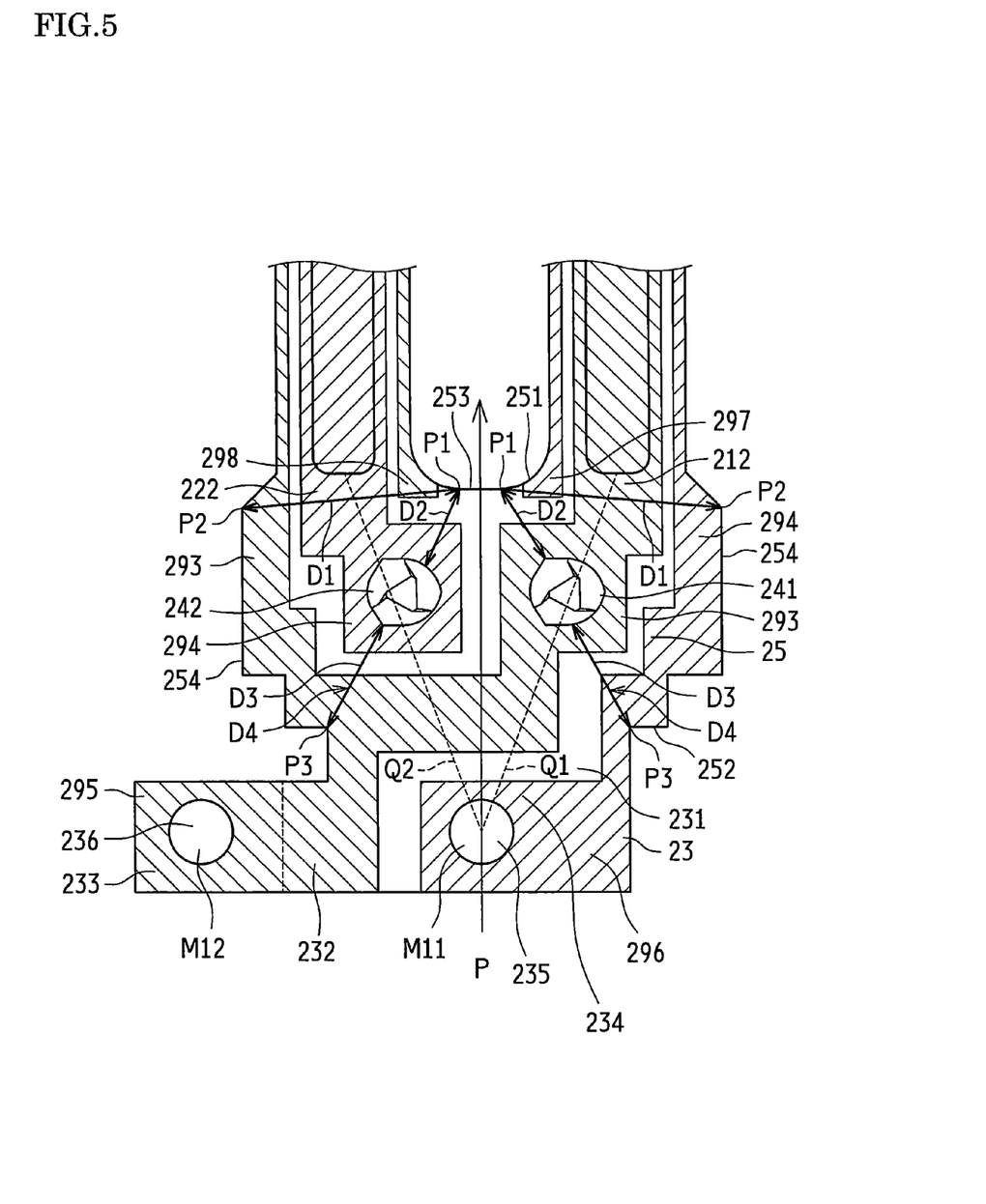
FIG. 5 is an enlarged planar view in which a base portion of the tuning fork-type crystal resonator plate illustrated in FIG. 2 is enlarged.

Also, as shown in FIGS. 2 and 5, the shortest distance from a boundary point P1 to a shortest point P2 is a shortest distance D1, where the boundary point P1 is the boundary point between the pronged portion 253 and vibrating portions (the base end portion 212 of the first leg portion 21 and the base end portion 222 of the second leg portion 22), and the shortest point P2 is a point on a side face 254 on the base portion 25 where the distance from the boundary point P1 on the base portion 25 to the side face 254 is shortest. Also, a distance D2 is the shortest distance connecting the boundary point P1 and the through holes 241 and 242, a shortest point P3 is a point on the side face 254 of the base portion 25 where the distance from the through holes 241 and 242 on the base portion 25 to the side face 254 is shortest, a distance D3 is the shortest distance connecting the through holes 241 and 242 and the shortest point P3, and a combined shortest distance D4 is the combined shortest distance obtained by combining the distance D2 and the distance D3. In the present embodiment, the combined shortest distance D4 is shorter than the shortest distance D1. By thus satisfying the relationship of the shortest distance D1 being greater than the combined shortest distance D4, stress that propagates to the joining portion 23 can be suppressed. This is related to the vibration site being a site on the shortest distance from the pronged portion 253 to the side face 254 of the base portion 25, and as a result of the shortest distance from the pronged portion 253 to the side face 254 in the base portion 25 changing from the shortest distance D1 to the combined shortest distance D4, the first leg portion 21 and the second leg portion 22 vibrate around a site on the combined shortest distance D4. Thus, as a result of the shortest distance transitioning from the shortest distance D1 to the combined shortest distance D4, stress produced by the vibrations can be concentrated on a site on the combined shortest distance D4. As a result, stress that propagates to the joining portion 23 can be suppressed, and vibration leakage can also be suppressed. Note that as long as the formation position of the through holes 241 and 242 on the base portion 25 satisfies the relationship of the shortest distance D1 being greater than shortest distance D4, the formation position can be arbitrarily set, and the center of the through holes 241 and 242 need not be arranged on a line passing along the combined shortest distance D4. Also, in the present embodiment, the shortest point P3, which is the shortest distance from the through holes 241 and 242 in the base portion 25 to the side face 254 of the base portion 25, is at one end of the constricted portion 255, as illustrated in FIG. 2, and this one end of the constricted portion 255 is where the width of the base portion 25 is narrowest. The site on the combined shortest distance D4 can thus be concentrated in the narrowest portion of the constricted portions 255, with such a configuration being favorable for reducing acoustic leaks (vibration leakage) very effectively.

The pair of the first leg portion 21 and the second leg portion 22, as illustrated in FIGS. 2 and 3, protrude from the one end face 251 of the base portion 25, and are arranged in parallel via the pronged portion 253. Note that the pronged portion 253 referred to here is provided in an intermediate position (central region) in the width direction of the one end face 251, and denotes the region between the two boundary points P1 (see FIG. 5). The tip portions 211 and 221 and the base end portions 212 and 222 of the first leg portion 21 and the second leg portion 22 are formed so as to be wide in a direction orthogonal to the protrusion direction as compared with other sites of the first leg portion 21 and the second leg portion 22. Of these, the wide regions of the tip portions 211 and 221 of the first leg portion 21 and the second leg portion 22 will be referred to as wide regions of the first leg portion 21 and the second leg portion 22. Also, the respective corner portions of the tip portions 211 and 221 of the first leg portion 21 and the second leg portion 22 are formed as curved surfaces. By thus forming the tip portions 211 and 221 so as to be wide, the tip portions 211 and 221 (tip end regions) can be utilized effectively, with such a configuration being useful in miniaturizing the tuning fork-type crystal resonator plate 2, and also in lowering the frequency. Also, by forming the corner portions of the respective tip portions 211 and 221 as curved surfaces, the tip portions 211 and 221 can be prevented from contacting the bank portion or the like when an external force is exerted, for instance. Note that the corner portions of the tip portions 211 and 221 referred to here are not limited to curved surfaces, and may be tapered or may be a shape that combines curved and tapered corners.

Also, in order to improve the series resonance resistance (CI value in the present embodiment; similar below) which deteriorates as a result of miniaturization of the tuning fork-type crystal resonator plate 2, a groove portion 27 is respectively formed in the one main surface 261 and the other main surface 262 of the pair of the first leg portion 21 and the second leg portion 22. Also, part of a side face 28 of the external form of the tuning fork-type crystal resonator plate 2 is formed so as to slope toward the one main surface 261 and the other main surface 262. This is due to the etching speed in the crystal direction (X and Y directions) of substrate material differing when the tuning fork-type crystal resonator plate 2 is formed by wet etching.

The joining portion 23 is, as shown in FIGS. 2 and 3, for electromechanically joining the extraction electrodes 293 and 294 which will be described below to external electrodes (the external portion referred to in the present invention, which in the present embodiment is the electrode pads 32 of the base 3). Specifically, the joining portion 23 protrudes from an intermediate position (central region) in the width direction of the other end face 252 of the base portion 25 opposite to the one end face 251 from which the pair of first leg portion 21 and the second leg portion 22 protrude. That is, the joining portion 23 protrudes from a position directly opposite to the pronged portion 253 arranged between the pair of the first leg portion 21 and the second leg portion 22.

In particular, in the present embodiment, the joining portion 23 is constituted by a short-side portion 231 that protrudes perpendicularly to the other end face 252 of the base portion 25 in planar view and is narrower than the other end face 252, and a long-side portion 232 that is arranged in line with the tip portion of the short-side portion 231, is bent at a right angle in planar view at the tip portion of the short-side portion 231, and extends in the width direction of the base portion 25, and a tip portion 233 of the joining portion 23 faces in the width direction of the base portion 25. That is, the joining portion 23 is formed in an L-shape in planar view, and a bend portion 234, which is the location of the bend formed in the L-shape in planar view, corresponds to the tip portion of the short-side portion 231. Because the joining portion 23 is thus formed in a state where the short-side portion 231 is narrower than the other end face 252 of the base portion 25, the effect of further suppressing vibration leakage increases.

Also, the one main surface 261 of the joining portion 23 has a first joining region 235 and a second joining region 236 that join to an external portion, the first joining region 235 being formed in a region of the bend portion 234 of the joining portion 23 formed in an L-shape in planar view on an extension of the center line P in the width direction of the base portion 25 (intermediate position in the width direction of the short-side portion 231 of the joining portion 23), and the second joining region 236 being formed in a region of the tip portion of the long-side portion 232 which equates to the tip portion 233 of the joining portion 23 formed in an L-shape in planar view. The connection electrode 296 (lead-out end portion of the extraction electrode 294) extracted via the extraction electrode 294 to an end portion (one end portion) of the short-side portion 231 from the second driving electrode 292 which will be discussed later is formed in the first joining region 235, and the connection electrode 295 (lead-out end portion of the extraction electrode 293) extracted via the extraction electrode 293 to an end portion (the tip portion 233) of the long-side portion 232 from the first driving electrode 291 which will be discussed later is formed in the second joining region 236.

By adopting such a configuration, vibration leakage (acoustic leaks) can be more efficiently suppressed without expanding the length of the joining portion 23. In particular, the first joining region 235 of the joining portion 23 that joins to an external portion can be joined electromechanically as one pole at the bend portion 234 in which acoustic leaks have been more efficiently suppressed, and the second joining region 236 of the joining portion 23 that joins to an external portion can be electromechanically joined as the opposite to pole at the tip portion 233 which is not affected by acoustic leaks or by stress or external force.

Also, metal films M1 (M11, M12) serving as plated bumps with a small plane area and a coarser surface than the connection electrode 295 and 296 are formed on the upper surfaces of these connection electrode 295 and 296. The metal films M1 (M11, M12) are formed in a circular shape in planar view having thickness of about 5-20 μm, for example, a diameter of about 50 μm, and a plane area of approximately 1962.5 μm². Note that after ultrasonic bonding (after flip-chip bonding (FCB)), at least the metal films M1 (M11, M12) will be spread flat in the surface direction, and will be approximately about half their original thickness. If the thickness of the metal films M1 (M11, M12) is less than 5 μm, the gap between the connection electrodes 295 and 296 of the tuning fork-type crystal resonator plate 2 and the electrode pads 32 of the base 3 will be small, and the electrical properties of the tuning fork-type crystal resonator 1 are likely to be adversely affected. If the thickness of the metal films M1 (M11, M12) is greater than 20 μm, tilting and position shift of the tuning fork-type crystal resonator plate 2 are likely to have an effect, and variation is also likely in the joining strength. Note that the shape of the metal films M1 (M11, M12) serving as plated bumps in planar view can be freely configured according to the shape of the connection electrodes or the like in planar view, such as being circular in shape such as round or elliptical or being polygonal in shape including rectangular or square.

With regard to the formation of the metal films M1 (M11, M12) on the joining portion 23, formation portions of the metal films (masks having window portions with a smaller plane area than the connection electrodes 295 and 296) which are not illustrated are formed on the first joining region 235 and the second joining region 236 of the joining portion 23 in a desired shape (rectangular window portion in the present embodiment) using photolithography, and the metal films M1 (M11, M12) are formed by plating on the formation portions of the metal films M1 (M11, M12) using a technique such as electrolytic plating. Thereafter, annealing may be performed.

Also, with the tuning fork-type crystal resonator plate 2 according to the present embodiment, the pair of the first driving electrode 291 and the second driving electrode 292 configured with different potentials, the extraction electrodes 293 and 294 extracted from the first driving electrode 291 and the second driving electrode 292 in order to electrically connect the first driving electrode 291 and the second driving electrode 292 to the electrode pads 32, and the connection electrodes 295 and 296 on whose tip portions are formed the metal films M1 are formed at the same time. Note that the extraction electrodes 293 and 294 referred to in the present embodiment are electrode patterns extracted from the pair of the first driving electrode 291 and the second driving electrode 292. The connection electrodes 295 and 296 are electrodes that are formed at the intended locations of joining sites to the base 3, on the tip portions (lead-out end portions) of the extraction electrodes 293 and 294.

Also, part of the pair of the first driving electrode 291 and the second driving electrode 292 is formed inside the groove portion 27. Vibration loss of the first leg portion 21 and the second leg portion 22 is thus suppressed even if the tuning fork-type crystal resonator plate 2 is miniaturized, enabling the CI value to be kept low.

The first driving electrode 291 is formed on both main surfaces of the first leg portion 21 (the one main surface 261 and the other main surface 262) and both side faces 28 of the second leg portion 22. Similarly, the second driving electrode 292 is formed in both main surfaces of the second leg portion 22 (the one main surface 261 and the other main surface 262), and both side faces 28 of the first leg portion 21.

The first driving electrode 291 and second driving electrode 292, the extraction electrodes 293 and 294 and the connection electrodes 295 and 296 of the above tuning fork-type crystal resonator plate 2 are thin films that are constituted by a chromium (Cr) layer being formed by metal deposition on the first leg portion 21 and the second leg portion 22 and a gold (Au) layer being formed on this chromium layer. These thin films are integrally formed at the same time by forming a thin film over the entire surface of a substrate using a technique such as vacuum deposition or sputtering, and then forming the thin film into desired shapes by metal etching using photolithography. Note that although the first driving electrode 291, the second driving electrode 292 and the extraction electrodes 293 and 294 are formed by lamination in the order of chromium (Cr) and gold (Au), lamination may, for example, be performed in order of chromium (Cr) and silver (Ag), in order of chromium (Cr), gold (Au) and chromium (Cr), in order of chromium (Cr), silver (Ag) and chromium (Cr), or the like.

Also, the extraction electrodes 293 and 294 are respectively formed on the one main surface 261 and the other main surface 262 of the tip portions 211 and 221 of the first leg portion 21 and the second leg portion 22 on the wide regions of the first leg portion 21 and the second leg portion 22 over substantially the entire surface. Adjustment metal films (frequency adjustment weights) M3 obtained by adjusting the frequency of the tuning fork-type crystal resonator plate 2 are integrally formed on the upper surfaces of the extraction electrodes 293 and 294 formed on the wide regions of the first leg portion 21 and the second leg portion 22 of the one main surface 261, so as to have a slightly smaller area than the extraction electrodes 293 and 294, by reducing the mass of the metal film through beam irradiation using a laser beam or the like or ion etching such as ion milling.

The above adjustment metal films M3 are formed, for example, by forming formation portions of the adjustment metal films M3 in a desired shape on the extraction electrodes 293 and 294 of the respective regions (wide regions) using photolithography, and plating the adjustment metal films M3 on the formation portions of the adjustment metal films M3 using a technique such as electrolytic plating. Thereafter, annealing may be performed. When forming these metal films (adjustment metal films M3) by plating, it is practically desirable for these metal films to be constituted at the same time with the same process as the above metal films M1 (M11, M12).

The frequencies of the tuning fork-type crystal resonator plates 2 constituted as described above are roughly adjusted by reducing the adjustment metal films M3 of the individual tuning fork-type crystal resonator plates 2 with beam irradiation or the like or by increasing the same with partial deposition after measuring the frequencies of the individual tuning fork-type crystal resonator plates 2, when in the state of a wafer for forming a large number of piezoelectric resonator blanks.

Each tuning fork-type crystal resonator plate 2 (piezoelectric resonator blank) that has undergone rough frequency adjustment and been removed from the wafer is mounted on a base 3 as a result of the metal films M1 (M11, M12) formed on the upper surfaces of the connection electrodes 295 and 296 on the one main surface 261 side being ultrasonically bonded to the electrode pads 32 of the base 3 using flip-chip bonding.

The frequency of the tuning fork-type crystal resonator plate 2 mounted on the base 3 undergoes final adjustment for fine tuning the frequency, by reducing the adjustment metal films M3 of the tuning fork-type crystal resonator plate 2 by beam irradiation, ion etching or the like after re-measuring the frequency.

Thereafter, a lid which is not illustrated is joined via the sealing member H to the base 3 mounted with the tuning fork-type crystal resonator plate 2 that has undergone final frequency adjustment, and the tuning fork-type crystal resonator plate 2 is hermetically sealed inside a casing constituted by the base 3 and the lid which is not illustrated. Note that hermetic sealing techniques include seam welding, beam welding and atmosphere heating.

A configuration such as described above enables acoustic leaks to be more efficiently prevented without hindering miniaturization of the tuning fork-type crystal resonator plate 2, and enables the occurrence of problems such as breakage of the tuning fork-type crystal resonator plate 2 to be prevented due to its resistance to stress and external force. In particular, vibration leakage (acoustic leaks) that occurs due to vibrations generated when driving the tuning fork-type crystal resonator plate 2 being out of sync can be suppressed without expanding the length or area of the joining portion 23. The likelihood of the vibrations getting out of sync when driving the tuning fork-type crystal resonator plate 2 is also reduced. In particular, since propagation of part of the vibrational energy produced by the pair of the first leg portion 21 and the second leg portion 22 can be more efficiently stopped as a result of the through holes 241 and 242 that are formed like an hourglass and whose wall surfaces inside the piezoelectric resonator blank (inside the tuning fork-type crystal resonator plate 2) are also formed in a spiral shape being added, vibration leakage (acoustic leaks) can be suppressed even more efficiently, and a configuration that is resistant to stress and external force can be realized as the joining region with an external portion.

Also, since a wiring structure that extends the extraction electrodes 293 and 294 between both back and front main surfaces (the one main surface 261 and the other main surface 262) via an edge portion or side end face around the pronged portion 253 of the tuning fork-type crystal resonator plate 2 or another edge portion or side end face of the base portion 25 close to the pronged portion 253 is not needed, a configuration with stable electrical connectivity in which the likelihood of disconnection or the like is reduced can be realized. Also, since a simpler wiring pattern design that also reduces the likelihood of disconnection or the like occurring with regard to the extraction electrodes 293 and 294 formed on the main surface of the base portion 25 of the tuning fork-type crystal resonator plate 2 is facilitated, since part of the extraction electrodes 293 and 294 is in contact with the pronged portion 253 without needing to be extracted between the base end portion 212 and the base end portion 222 of the pair of leg portions (the first leg portion 21 and the second leg portion 22), miniaturization of the base portion 25 of the tuning fork-type crystal resonator plate 2 can also be realized at the same time.

Also, position shift or extrusion do not occur with respect to the electrode pads 32 and the connection electrodes 295 and 296 that have been further miniaturized, by using the metal films M1 (M11, M12) serving as plated bumps in the joining portion 23. The tuning fork-type crystal resonator plate 2 can be electromechanically joined to the base 3 in a stable manner using the metal films M1 (M11, M12). Specifically, by using the metal films M1 (M11, M12) serving as plated bumps, the metal films M1 (M11, M12) serving as plated bumps can be formed in the tuning fork-type crystal resonator plate 2, prior to mounting the tuning fork-type crystal resonator plate 2 to an external portion (base 3).

Because the metal films M1 (M11, M12) serving as plated bumps are always formed in desired formation positions of the tuning fork-type crystal resonator plate 2 as a result, even in the case where, for example, the mounting position of the tuning fork-type crystal resonator plate 2 to an external portion (base 3) shifts from a desired position, mounting the tuning fork-type crystal resonator plate 2 to the external portion (base 3) in a state where the bumps have shifted can be prevented, and stable mounting of the tuning fork-type crystal resonator plate 2 to the base 3 can be carried out. Also, because the metal films M1 (M11, M12) having a coarser surface and smaller plane area than the connection electrodes 295 and 296 are used, the metal films M1 (M11, M12) are joined by thermal diffusion to the electrode pads 32 in a more stable state, and the electromechanical joint is stabilized.

The present invention can be embodied in other forms without departing from the spirit or essential characteristics thereof. The foregoing embodiments are therefore to be considered in all respects as illustrative and not restrictive. The scope of the invention is indicated by the appended claims rather than by the foregoing description. Furthermore, all modifications and changes that come within the meaning and range of equivalency of the claims are intended to be embraced therein.

This application claims the benefit of Japanese Patent Application No. 2011-024231, filed Feb. 7, 2011, which is hereby incorporated by reference herein in its entirety.

INDUSTRIAL APPLICABILITY

The present invention is applicable to piezoelectric resonator devices such as tuning fork-type crystal resonators.

DESCRIPTION OF REFERENCE NUMERALS 1 tuning fork-type crystal resonator
2 tuning fork-type crystal resonator plate
21 first leg portion
211 tip portion
212 base end portion
22 second leg portion
221 tip portion
222 base end portion
23 joining portion
231 short-side portion
232 long-side portion
233 tip portion
234 bend portion
235 first joining region
236 second joining region
241, 242 through holes
25 base
251 one end face
252 other end face
253 pronged portion
254 side face
255 constricted portion
261 one main surface
262 other main surface
27 groove portion
28 side face
291, 292 driving electrodes
293, 294 extraction electrodes
295, 296 connection electrodes
297, 298 other end portions of extraction electrodes
3 base
30 bank portion
31 stepped portion
32 electrode pad
33 terminal electrode
34 metal film layer
D1 shortest distance
D2, D3 distance
D4 combined shortest distance
H sealing member
M1 (M11, M12) metal films
M3 adjustment metal film
P center line of base portion
P1 boundary point
P2 shortest point
Q1, Q2 line segments
S1 wall surface of through holes
T1, T2 both end portions of through holes
T3 inner portion of tuning fork-type crystal resonator plate

The invention claimed is:

1. A tuning fork-type piezoelectric resonator plate in which a piezoelectric resonator blank is constituted by a pair of leg portions serving as vibrating portions and a base portion from which the leg portions protrude,
the pair of leg portions are arranged in parallel protrudingly from one end face of the base portion, and a pronged portion is formed between the pair of leg portions in an intermediate position in a width direction of the one end face of the base portion,
the base portion has formed therein a pair of through holes along the one end face of the base portion, and has, on another end face side opposite to the one end face of the base portion, a joining region that joins to an external portion,
the pair of through holes are formed in positions closer to a center line in the width direction of the base than to base end portions of the pair of leg portions, in a state where both of the through holes are not in contact with each other, and
with the through holes, a plane area of the through holes progressively decreases in size toward an inner portion of the piezoelectric resonator blank from both end portions of the through holes in both back and front main surfaces of the piezoelectric resonator blank, and a wall surface of the through holes is formed in a spiral shape.

2. The tuning fork-type piezoelectric resonator plate according to claim 1,
wherein a pair of driving electrodes, and extraction electrodes respectively extracted from the pair of driving electrodes, are formed on the back and front main surfaces of the piezoelectric resonator blank,
the pair of through holes are formed in formation regions of the extraction electrodes,
conducting electrodes are formed in the pair of through holes, and the extraction electrodes formed on the back and front main surfaces are electrically connected using the conducting electrodes, and
part of the extraction electrodes is in contact with the pronged portion without being extracted between the base end portions of the pair of leg portions.

3. The tuning fork-type piezoelectric resonator plate according to claim 1,
wherein a piezoelectric resonator blank is constituted by a pair of leg portions serving as vibrating portions, a joining portion that joins to an external portion, and a base portion from which the leg portions and the joining portion protrude,
the pair of leg portions are arranged in parallel protrudingly from one end face of the base portion, and a pronged portion is formed between the pair of leg portions in an intermediate position in a width direction of the one end face of the base portion, the base portion has formed therein a pair of through holes along the one end face of the base portion, the joining portion protrudes from a position opposite to the pronged portion on another end face opposite to the one end face of the base portion, and has a first joining region that joins to an external portion, and the first joining region joins to an external portion, in a region that is in an intermediate position in the width direction of the joining portion.

4. The tuning fork-type piezoelectric resonator plate according to claim 3, wherein the through holes are formed in positions on line segments connecting the first joining region and the base end portions of the leg portions.

5. The tuning fork-type piezoelectric resonator plate according to claim 2, wherein the joining portion is formed in an L-shape in planar view, and the first joining region is formed in a bend portion which is a location of a bend formed in the L-shape in planar view, and a second joining region that joins to an external portion is formed in a tip portion of the joining portion.

6. The tuning fork-type piezoelectric resonator plate according to claim 1, wherein a relationship of a shortest distance D1 being greater than a combined shortest distance D4 is satisfied, where a boundary point P1 is a boundary point between the pronged portion and the vibrating portions, a shortest point P2 is a point on a side face of the base portion at which a distance from the boundary point P1 on the base portion to the side face is shortest, the shortest distance D1 is a distance from the boundary point P1 to the shortest point P2, a distance D2 is a shortest distance connecting the boundary point P1 and the through holes, a shortest point P3 is a point on the side face of the base portion at which a distance from the through holes in the base portion to the side face is shortest, a distance D3 is a distance connecting the through holes and the shortest point P3, and the combined shortest distance D4 is a combined shortest distance obtained by combining the distance D2 and the distance D3.

7. A tuning fork-type piezoelectric resonator in which the tuning fork-type piezoelectric resonator plate according to claim 1 is provided inside a casing of the tuning fork-type piezoelectric resonator.

* * * * *